United States Patent
Oh et al.

(10) Patent No.: US 8,472,237 B2
(45) Date of Patent: Jun. 25, 2013

(54) SEMICONDUCTOR DEVICES AND METHODS OF DRIVING THE SAME

(75) Inventors: Jeong-hoon Oh, Seoul (KR);
Kyung-chang Ryoo, Seongnam-si (KR);
Byung-gook Park, Seoul (KR);
Kyung-seok Oh, Seongnam-si (KR);
In-gyu Baek, Seoul (KR)

(73) Assignees: Samsung Electronics Co., Ltd., Gyeonggi-do (KR); Seoul National University R&DB Foundation, Seoul (KR)

( * ) Notice: Subject to any disclaimer, the term of this patent is extended or adjusted under 35 U.S.C. 154(b) by 275 days.

(21) Appl. No.: 12/943,465

(22) Filed: Nov. 10, 2010

(65) Prior Publication Data

US 2011/0170331 A1 Jul. 14, 2011

(30) Foreign Application Priority Data

Jan. 8, 2010 (KR) .................. 10-2010-0001878

(51) Int. Cl.
*G11C 11/21* (2006.01)
(52) U.S. Cl.
USPC ........................................ 365/148

(58) Field of Classification Search
USPC ........................................ 365/148
See application file for complete search history.

(56) References Cited

U.S. PATENT DOCUMENTS

| 2007/0195581 A1* | 8/2007 | Morimoto .................... 365/148 |
| 2009/0212273 A1* | 8/2009 | Zhao et al. ....................... 257/4 |
| 2010/0110765 A1* | 5/2010 | Tian et al. ................... 365/148 |
| 2011/0002161 A1* | 1/2011 | Jin et al. ....................... 365/163 |

FOREIGN PATENT DOCUMENTS

| JP | 2007-184419 | 7/2007 |
| JP | 2008-287827 | 11/2008 |
| KR | 102008001504 | 2/2008 |

* cited by examiner

*Primary Examiner* — Hoai V Ho
*Assistant Examiner* — Jay Radke
(74) *Attorney, Agent, or Firm* — Harness, Dickey & Pierce, P.L.C.

(57) ABSTRACT

Example embodiments disclose a semiconductor device using resistive memory material layers and a method of driving the semiconductor device. The semiconductor device includes a plurality of memory cells. At least one memory cell includes a uni-polar variable resistor and a bi-polar variable resistor connected in series and configured to switch between low resistance states and high resistance states, respectively, according to an applied voltage.

21 Claims, 12 Drawing Sheets

SEMICONDUCTOR DEVICES AND METHODS OF DRIVING THE SAME

CROSS-REFERENCE TO RELATED APPLICATIONS

This application claims priority under 35 U.S.C. §119 to Korean Patent Application No. 10-2010-0001878, filed on Jan. 8, 2010, in the Korean Intellectual Property Office, the entire contents of which are incorporated herein by reference.

BACKGROUND

Inventive concepts relate to semiconductor devices and a methods of driving the same, and more particularly, to a non-volatile memory device using a resistive memory material film and a method of driving the non-volatile memory device.

Recently, demands for portable digital appliances such as digital cameras, MPEG (Moving Picture Experts Group) layer 3 (MP3) players, personal digital assistants (PDAs), and mobile phones have increased, and thus, the markets of non-volatile memories are rapidly expanding. Flash memories of high density, which have low fabrication costs per bit, are widely used as programmable non-volatile memories. However, flash memory devices require relatively large transistors for performing a hot-carrier injection operation required in programming, and also require thick tunneling oxide layers that may bear high internal voltage for ensuring data storage for 10 years or longer. Thus, there is a limitation in scaling the flash memories. Recently, since flash memories have reached a lower limit in scaling, resistance random access memories (ReRAMs) using a resistive memory material are drawing attention as non-volatile memories that may substitute for the flash memories.

Since the resistive memory material has a bi-stable resistance state, in which resistance status may reciprocally vary depending on electric pulses applied to the resistive memory material, the ReRAM may operate without using a transistor, and thus, may be finely fabricated to a cell size of 10 nm or less.

The ReRAM includes wires crossing over each other and cells that are formed on intersections between the wires and that include resistive memory materials. However, when the cells are formed in such a simple structure, there may be an error in a reading operation because signals may be detected from neighboring cells. To address this problem, a rectifying device such as a diode or a switching device such as a transistor is additionally formed in the cell structure.

SUMMARY

Inventive concepts provide a semiconductor device that may be highly integrated and fabricated with low fabrication costs by preventing non-volatile memory cells from interfering with each other.

Inventive concepts provide a method of driving a semiconductor device to record information in the non-volatile memory cells.

According to an aspect of inventive concepts, there is provided a semiconductor device including a plurality of memory cells, wherein at least one memory cell includes a uni-polar variable resistor and a bi-polar variable resistor connected in series and configured to switch between low resistance states and high resistance states, respectively, according to an applied voltage. A magnitude of resistance of the uni-polar variable resistor may vary regardless of a polarity of the applied voltage, and a magnitude of resistance of the bi-polar variable resistor may be based on the polarity of the applied voltage. A bit value stored in the memory cell corresponds to one of the uni-polar variable resistor and the bi-polar variable resistor being in the low resistance state and the other variable resistor being in the high resistance state.

Magnitudes of a set voltage and a reset voltage of the bi-polar variable resistor may be greater than a magnitude of a set voltage of the uni-polar variable resistor. A voltage for switching the uni-polar variable resistor to the low resistance state may be applied to the one or more memory cells to read a bit value stored in the plurality of memory cells.

A set voltage and a reset voltage of the bi-polar variable resistor may be smaller than a reset voltage of the uni-polar variable resistor. The at least one memory cell is configured to receive a voltage for switching the bi-polar variable resistor to the low resistance state to read a bit value stored in the at least one memory cell.

The uni-polar variable resistor and the bi-polar variable resistor may include a first electrode layer and a second electrode layer facing each other, and a uni-polar resistive material layer and a bi-polar resistive material layer between the first and second electrode layers. The uni-polar variable resistor and the bi-polar variable resistor may further include a third electrode layer between the uni-polar and bi-polar resistive material layers.

Each of the uni-polar and bi-polar resistive material layers may include a transition metal oxide, a chalcogen-based compound, or a perovskite-based compound. Each of the first and second electrode layers may be formed of one selected from the group consisting of Pt, Ru, Ir, Ag, Al, Ti, Ta, W, Si, Cu, Ni, Co, conductive nitrides thereof, conductive oxides thereof, and combinations thereof.

The plurality of memory cells are arranged in a matrix, and the semiconductor device further includes first signal lines and second signal lines electrically connected to ends of the plurality of memory cells.

The plurality of memory cells are between the first and second signal lines where the first and second signal lines cross over each other. The uni-polar and bi-polar variable resistors may have pillar structures, the pillar structures being perpendicular to a main surface of a substrate.

The pillar structure may include a plurality of pillars being stacked perpendicular to the main surface of the substrate, and at least one of the signal lines is between two stacked pillars of the plurality of pillars.

According to another aspect of inventive concepts, there is provided a method of driving a semiconductor device including a uni-polar variable resistor and a bi-polar variable resistor connected in series and configured to be switched between low resistance states and high resistance states, respectively. The method includes recording a bit value by setting one of the uni-polar variable resistor and the bi-polar variable resistor to the low resistance state and the other to the high resistance state. The set states of the uni-polar variable resistor and the bi-polar variable resistor correspond to the bit value.

Magnitudes of a set voltage and a reset voltage of the bi-polar variable resistor may be greater than a magnitude of a set voltage of the uni-polar variable resistor. The recording of a bit value may include switching the uni-polar and bi-polar variable resistors to low resistance states by applying a first voltage to the uni-polar and bi-polar variable resistors, the first applied voltage being equal to or greater than the set voltage of the bi-polar variable resistor, and switching the uni-polar variable resistor to the high resistance state by applying a second voltage to the uni-polar and bi-polar variable resistors, the second applied voltage being between a reset voltage and the set voltage of the uni-polar variable resistor. The recording of a bit value may include switching the hi-polar variable resistor to the low resistance state and the uni-polar variable resistor to the high resistance state, by applying a voltage to the uni-polar and hi-polar variable resistors, the applied voltage being equal to or greater than the reset voltage of the bi-polar variable resistor.

The method may further include reading the bit value by switching the uni-polar variable resistor to the low resistance state. The reading may include applying a voltage that is greater than the set voltage of the uni-polar variable resistor and smaller than the set voltage of the bi-polar variable resistor.

Magnitudes of the set voltage and the reset voltage of the bi-polar variable resistor may be smaller than a magnitude of reset voltage of the uni-polar variable resistor. The recording of a bit value may include switching the uni-polar and bi-polar variable resistors to low resistance states by applying a first voltage to the uni-polar and bi-polar variable resistors, the first applied voltage being equal to or greater than the set voltage of the uni-polar variable resistor, and switching the bi-polar variable resistor to the high resistance state by applying a second voltage to the uni-polar and bi-polar variable resistors, the second applied voltage being between the reset voltage of the bi-polar variable resistor and the negative set voltage of the uni-polar variable resistor.

The recording of a bit value may include switching the uni-polar variable resistor to the high resistance state and the bi-polar variable resistor to the low resistance state, by applying a voltage to the uni-polar and bi-polar variable resistors, the applied voltage being between the reset voltage and the set voltage of the uni-polar variable resistor.

The method may further include reading the bit value by switching the bi-polar variable resistor to the low resistance state. The reading of a bit value may include applying a voltage that is greater than the set voltage of the bi-polar variable resistor and smaller than the reset voltage of the uni-polar variable resistor.

At least another example embodiment provides a semiconductor device including a plurality of memory cells. At least one memory cell includes a first type resistor and a second type resistor connected in series and configured to switch between at least first and second resistance states, respectively, according to an applied voltage. Resistances of the first type resistor and the second type resistor may vary differently from one another with respect to a polarity of the applied voltage.

Another example embodiment discloses an electronic system including a bus, a processor configured to transmit and receive data through the bus, and a memory unit configured to store the data. The memory unit includes a semiconductor device having a plurality of memory cells. At least one memory cell includes a first type resistor and a second type resistor connected in series and configured to switch between at least first and second resistance states, respectively, according to an applied voltage. Resistances of the first type resistor and the second type resistor may vary differently from one another with respect to a polarity of the applied voltage.

BRIEF DESCRIPTION OF THE DRAWINGS

Example embodiments of inventive concepts will be more clearly understood from the following detailed description taken in conjunction with the accompanying drawings in which.

DETAILED DESCRIPTION OF EXAMPLE EMBODIMENTS

Figure 1:
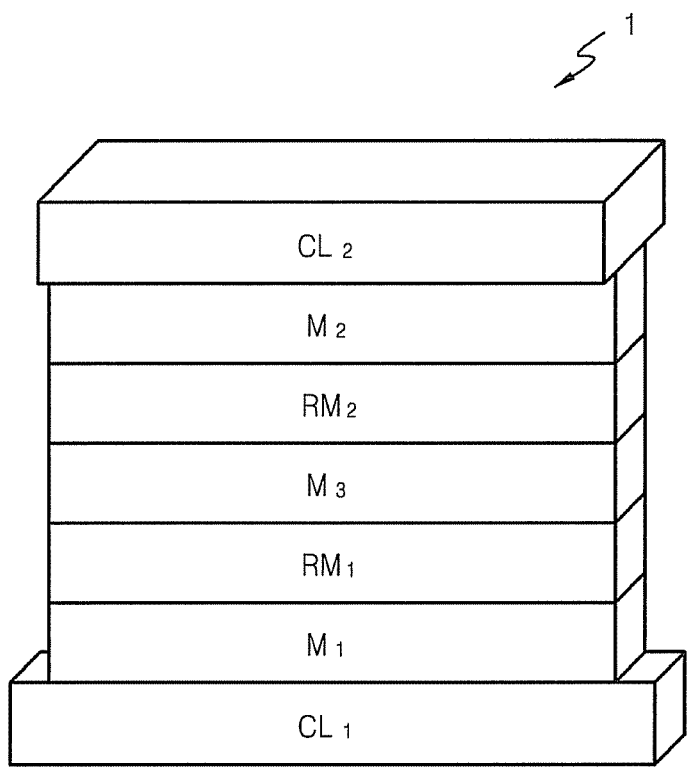
FIG. 1 is a perspective view of a unit cell structure in a resistance random access memory (ReRAM) according to an example embodiment of inventive concepts.

Example embodiments of inventive concepts will be described with reference to accompanying drawings.

Although a few example embodiments of inventive concepts are shown and described, it would be appreciated by those of ordinary skill in the art that changes may be made in these example embodiments without departing from the principles and spirit of example embodiments, the scope of which is defined in the claims and their equivalents.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. Like numbers refer to like elements throughout. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Example embodiments of inventive concepts are described herein with reference to cross-section illustrations that are schematic illustrations of example embodiments (and intermediate structures) of inventive concepts. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

In the present specification, terminologies such as wafer and substrate may denote a semiconductor layer on a base structure such as silicon, silicon-on-insulator (SOI), or silicon-on-sapphire (SOS), doped or undoped semiconductor layer, and transformed semiconductor layer. In addition, the terminologies of wafer and substrate are not limited to the silicon-based material, and may denote group III-V semiconductor material such as silicon-germanium, germanium, or gallium-arsenic compound material.

In addition, a set voltage denotes a voltage for switching a resistive memory material layer in a high-resistance state to a low-resistance state, and a reset voltage denotes a voltage for switching a resistive memory material layer in a low-resistance state to a high-resistance state.

FIG. 1 is a perspective view of a unit cell structure 1 in a resistive random access memory (ReRAM) device according to an example embodiment of inventive concepts.

Referring to FIG. 1, the unit cell structure 1 includes electrode layers $M_1$ and $M_2$ facing each other, a bi-polar resistive memory material layer $RM_1$ and a uni-polar resistive memory material layer $RM_2$ fowled between the electrode layers $M_1$ and $M_2$. The bi-polar resistive memory material layer $RM_1$ and the uni-polar resistive memory material layer $RM_2$ are electrically connected to each other in series between the electrode layers $M_1$ and $M_2$. In another example embodiment, the unit cell structure 1 may further include an electrode layer $M_3$ between the resistive memory material layers $RM_1$ and $RM_2$, as shown in FIG. 1.

In another example embodiment, the electrode layers $M_1$ and $M_2$ located on sides of the resistive memory material layers $RM_1$ and $RM_2$, respectively, may be coupled to conductive lines $CL_1$ and $CL_2$ for accessing the unit cell structure 1, respectively. One of the conductive lines $CL_1$ and $CL_2$, for example, the lower conductive line $CL_1$, may be a signal line such as a bit line, and the other, for example, the upper conductive line $CL_2$, may be a signal line such as a word line.

The resistive memory material layers $RM_1$ and $RM_2$ may be transition metal oxide layers, for example, one of a $TiO_2$ layer, NiO layer, $HfO_2$ layer, $Al_2O_3$ layer, $ZrO_2$ layer, and ZnO layer, or combinations thereof. Otherwise, the resistive memory material layers $RM_1$ and $RM_2$ may be formed of a material, the resistance of which may be variably switched, for example, a chalcogen-based compound layer or a perovskite-based compound layer. A material having a large ratio between the resistance value in the low resistance state and the resistance value in the high resistance state and a small driving voltage for reducing power consumption may be selected to form the resistive memory material layers $RM_1$ and $RM_2$. As well known in the art, the resistive memory material layers $RM_1$ and $RM_2$ may be formed by using a chemical vapor deposition (CVD) method or an atomic layer deposition (ALD) method.

The electrode layers $M_1$, $M_2$, and $M_3$ may be formed of Pt, Ru, Ir, Ag, Al, Ti, Ta, W, Si, Cu, Ni, Co, conductive nitrides thereof, for example, TiN, or combinations thereof, for example, Ti/TiN. For example, the electrode layers $M_1$, $M_2$, and $M_3$ may be TiN, which is compatible with Si CMOS-based processes. The electrode layers $M_1$, $M_2$, and $M_3$ may be formed by a CVD method or a physical vapor deposition (PVD) method. In FIG. 1, the resistive memory material layers $RM_1$ and $RM_2$ and the electrode layers $M_1$, $M_2$, and $M_3$ are shown as single layers, but, they may have multi-layered structures including appropriate barrier layers.

Figure 2A:
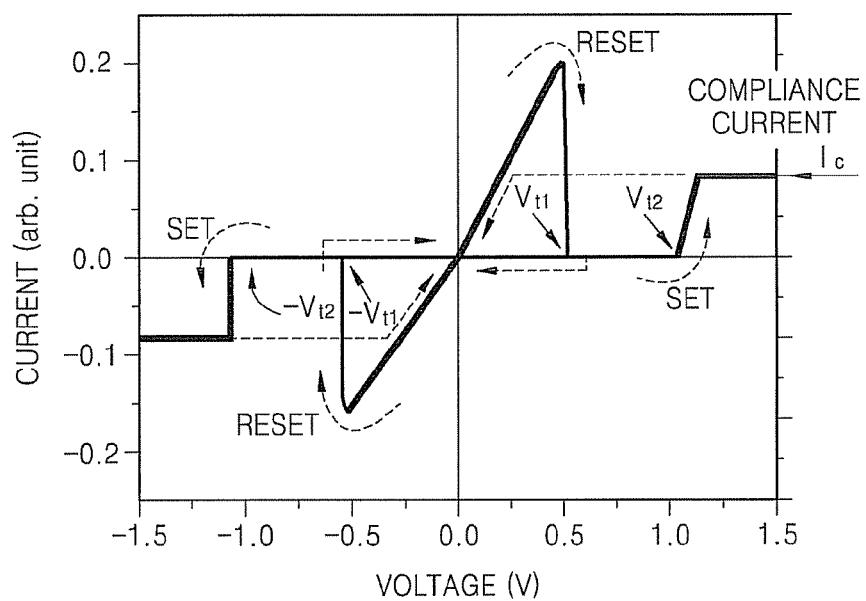
FIGS. 2A and 2B are graphs showing voltage versus current for illustrating switching characteristics of a uni-polar resistive memory material and a bi-polar resistive memory material layer shown in FIG. 1, according to example embodiments of inventive concepts.
Figure 2B:
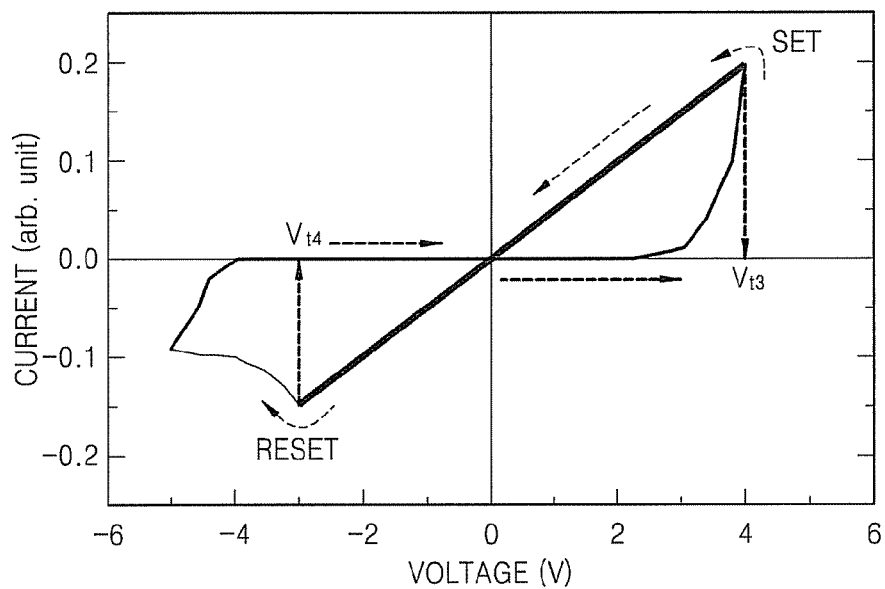

FIGS. 2A and 2B are voltage-current graphs illustrating switching characteristics of the uni-polar resistive memory material layer $RM_2$ and the bi-polar resistive memory material layer $RM_1$ shown in FIG. 1, according to example embodiments of inventive concepts. As described below, resistances of the uni-polar resistive memory material layer $RM_2$ and the bi-polar resistive memory material layer $RM_1$ vary differently from one another with respect to a polarity of an applied voltage. In at least some example embodiments, a magnitude of resistance of the uni-polar resistive memory material layer $RM_2$ may vary regardless of a polarity of an applied voltage, and a magnitude of resistance of the bi-polar resistive memory material layer $RM_1$ may be based on the polarity of the applied voltage.

Referring to FIG. 2A, for evaluating electrical characteristics of the uni-polar resistive memory material layer $RM_2$, a trial device which includes an NiO layer as the resistive memory material layer and Pt electrodes as upper and lower electrodes of the NiO layer, is fabricated. An initially formed NiO thin film is a general insulating layer in the high resistance state. In the NiO thin film, electric current hardly flows and resistance hardly changes when the voltage is increased. Therefore, in order to form the NiO thin film as the resistive memory material layer, the NiO thin film has to be changed to states in which the resistance may vary reciprocally, which is referred to as a forming process. For example, the forming process may be performed by applying a voltage having a magnitude corresponding to a dielectric breakdown voltage to the initially formed NiO thin film, while applying a compliance current Ic to NiO thin film so as to restrict the current flowing through the NiO thin film. The forming process is an example, and inventive concepts are not limited thereto.

When a voltage is swept from 0V in a positive direction with respect to the NiO thin film on which the forming process is performed, as denoted by the solid line of FIG. 2A, the current increases, meaning that the NiO layer is in the low resistance state. When the voltage reaches to a voltage $V_{r1}$ during the voltage sweeping, the current flowing in the NiO thin film is rapidly reduced. The voltage $V_{r1}$ is a reset voltage $V_{RESET}$. After that, even if the voltage increases gradually from 0V, the current hardly flows, meaning that the NiO thin film is in the high resistance state.

After that, when the voltage applied to the NiO thin film in the high resistance state is continuously increased, the current rapidly increases at a voltage $V_{r2}$, which is greater than the reset voltage. The voltage $V_{r2}$ is a set voltage $V_{SET}$. After that, when the voltage is swept between the voltage of 0V and $V_{r1}$, the current increases along the thick solid line, that is, in the low resistance state.

As shown in FIG. 2A, the voltage-current characteristics shown in the positive voltage section and the negative voltage section are the same as each other.

As described above, since the resistance variation is constant without regard to the polarity of the applied voltage, the resistance variation is referred to as a uni-polar resistive switching. Thus, in the negative voltage section, a reset voltage may be defined as $-V_{r1}$, and a set voltage may be defined as $-V_{r2}$.

Since the uni-polar resistive memory material layer $RM_2$ varies reciprocally, the switching characteristic between the low resistance state and the high resistance state may be reproducible. In addition, since the resistive switching may be obtained by applying a single polarity of a voltage, a voltage region having a single polarity may be used to operate the uni-polar resistive memory material layer $RM_2$, which will be described later.

Referring to FIG. 2B, for evaluating electrical characteristics of the bi-polar resistive memory material layer $RM_1$, a trial device having a $TiO_2$ layer as the resistive memory material and Pt electrodes as the upper and lower electrodes is fabricated.

Unlike the above-described uni-polar resistive switching, bi-polar resistive switching means that polarities of voltages generating transitions between the high resistance state and the low resistance state are different from each other. As described with reference to FIG. 2A, an initially formed $TiO_2$ thin film is an insulating layer in a high resistance state, and in which current hardly flows and the resistance does not change even when the applied voltage increases.

Therefore, in order for the resistive memory material layer to have the bi-polar resistive switching characteristic, the forming process has to be performed. For example, a first forming process is performed so that the $TiO_2$ thin film may have the uni-polar switching characteristic, as described with reference to FIG. 2A. When the first forming process is finished, the $TiO_2$ thin film is in the low resistance state. After that, a voltage that is greater than the reset voltage $V_{RESET}$ of the uni-polar switching and smaller than the set voltage $V_{SET}$ is applied to the $TiO_2$ to perform a second forming process for changing the $TiO_2$ thin film from the low resistance state to the high resistance state, and thus, a bi-polar resistive memory material layer having the bi-polar resistive switching characteristic may be obtained. These forming processes are examples, and inventive concepts are not limited thereto.

After the forming process is performed on the $TiO_2$ thin film, when the voltage applied to the $TiO_2$ thin film is swept from 0V in the positive direction, the current hardly flows as denoted by the thin solid line of FIG. 2B. When the voltage applied to $TiO_2$ thin film reaches a certain voltage $V_{r3}$, the current flowing in the $TiO_2$ thin film is rapidly increased. At this time, the $TiO_2$ thin film is in the low resistance state. The voltage $V_{r3}$ is a set voltage $V_{SET}$. As described above, after applying the set voltage $V_{SET}$ to the $TiO_2$ thin film, the current flows through the $TiO_2$ thin film between the voltage 0V and the voltage $V_{r3}$.

When the voltage applied to the $TiO_2$ thin film in the low resistance state is swept from 0V in the negative direction, as denoted by the thick solid line of FIG. 2B, negative current increases. After that, when the voltage reaches a certain voltage $V_{r4}$, the current flowing through the $TiO_2$ thin film is rapidly reduced. At this time, the $TiO_2$ thin film is in the high resistance state. The voltage $V_{r4}$ is a reset voltage $V_{RESET}$. As described above, after applying the reset voltage $V_{RESET}$ to the $TiO_2$ thin film, the current does not flow in a voltage region between the voltage $V_{r3}$ and the voltage $V_{r4}$.

As described above, the bi-polar resistive switching operation shows different switching characteristics according to the polarity of the applied voltage. That is, the positive variable resistance is switched from the high resistance state to the low resistance state at the positive set voltage $V_{r3}$, and is switched from the low resistance state to the high resistance state at the negative reset voltage $V_{r4}$.

Bit values "0" and "1" may be aligned to resistance states of the resistive memory material layer as recording information. The bit value "1" may be aligned to the low resistance state, and the bit value "0" may be aligned to the high resistance state. In example embodiments of inventive concepts, in the unit resistive memory cell having a structure in which the uni-polar resistive memory material layer $RM_2$ and the bi-polar resistive memory material layer $RM_1$ are connected in series, the bit value "1" is aligned to a case where the bi-polar resistive memory material layer $RM_1$ is in the low resistance state and the uni-polar resistive memory material layer $RM_2$ is in the high resistive state.

On the other hand, in the unit resistive memory cell, the bit value "0" is aligned to a case where the bi-polar resistive memory material layer $RM_1$ is in the high resistance state and the uni-polar resistive memory material layer $RM_2$ is in the low resistance state. However, inventive concepts are not limited to the example above, and the bit values "1" and "0" may be aligned inversely.

According to example embodiments of inventive concepts, since one of the bi-polar and uni-polar resistive memory material layers $RM_1$ and $RM_2$ in the unit resistive memory cell is in the high resistance state in a state where the bit value "1" or "0" is recorded, when a memory device of an array type is foamed by using the unit resistive memory cells, current paths through neighboring cells that are not selected are blocked. Accordingly, a rectifying device such as a diode or a switching device such as a transistor that is conventionally adopted to prevent the signal from being detected from non-selected cells may be omitted.

Figure 3A:
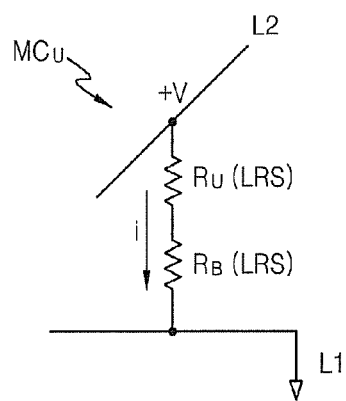
FIGS. 3A through 3C are equivalent circuit diagrams illustrating processes of recording information in unit resistive memory cells, according to an example embodiment of inventive concepts.
Figure 3B:
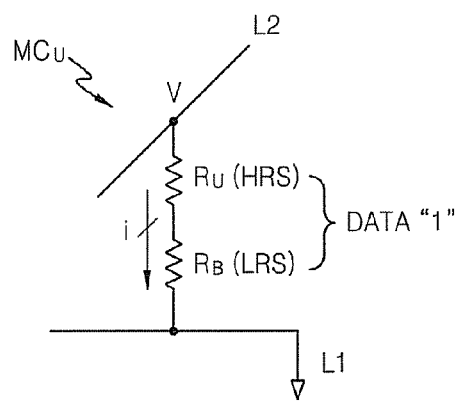

FIGS. 3A through 3B are equivalent circuit diagrams for illustrating a method of recording information in a unit resistive memory cell ($MC_U$), according to example embodiments. A resistor $R_B$ denotes a resistance of the bi-polar resistive memory material layer (hereinafter, referred to as bi-polar variable resistors), and a resistor $R_U$ denotes a resistance of the uni-polar resistive memory material layer (hereinafter, referred to as uni-polar variable resistors). For the convenience of description, it is assumed that the resistance of the electrode layers is 0. In addition, it is assumed that the voltage of the upper conductive line $L_2$ is the positive voltage when it is compared with the voltage of the lower conductive line $L_1$. Therefore, the current flowing in the arrow direction is positive current.

In the equivalent circuit diagrams, the resistor $R_B$ and the resistor $R_U$ are serially connected to each other between the conductive lines $L_1$ and $L_2$. An order of arranging the resistor $R_B$ and the resistor $R_U$ which are serially connected to each other may be inverse. The conductive lines $L_1$ and $L_2$ may be respectively one of the word line and the bit line for accessing the unit resistive memory cell $MC_U$.

Recording of Bit Value "1"

In order to record the bit value "1" in the unit resistive memory cell $MC_U$, the bi-polar resistive memory material layer is induced to the low resistance state and the uni-polar resistive memory material layer is induced to the high resistance state. To this end, referring to FIG. 3A, a voltage that changes the high resistance states of the resistors $R_B$ and $R_U$ to the low resistance states may be applied between the conductive lines L1 and L2. For example, when the magnitudes of the set voltage $V_{t3}$ and the reset voltage $V_{t4}$ of the bi-polar resistive memory material layer (that is, $|V_{t3}|$ and $|V_{t4}|$) are both greater than the magnitudes of the reset voltage $V_{t1}$ and the set voltage $V_{t2}$ of the uni-polar resistive memory material layer (that is, $|V_{t1}|$ and $|V_{t2}|$), an appropriate positive voltage that is equal to or greater than the positive voltage $V_{t3}$ may be applied. In this case, the resistors $R_B$ and $R_U$ are switched to the low resistance states.

After that, as shown in FIG. 3B, a voltage that may selectively change the low resistance state of the resistor $R_U$ to the high resistance state may be applied between the conductive lines $L_1$ and $L_2$. For example, when magnitudes of the set voltage $V_{t3}$ and the reset voltage $V_{t4}$ of the bi-polar resistive memory material layer (that is, $|V_{t3}|$ and $|V_{t4}|$) are greater than the magnitudes of the reset voltage $V_{t1}$ and the set voltage $V_{t2}$ of the uni-polar resistive memory material layer (that is, $|V_{t1}|$ and $|V_{t2}|$), for example, a voltage between the reset voltage $V_{t1}$ and the set voltage $V_{t2}$ of the uni-polar resistive memory material layer may be applied between the conductive lines $L_1$ and $L_2$. Then, the bit value "1" of the state where the bi-polar resistive memory material layer is in the low resistance state and the uni-polar resistive memory material layer is in the high resistance state is recorded in the unit resistive memory cell $MC_U$.

As another example, the magnitudes of the set voltage $V_{t3}$ and the reset voltage $V_{t4}$ of the bi-polar resistive memory material layer (that is, $|V_{t3}|$ and $|V_{t4}|$) may each be smaller than the magnitude of the reset voltage $V_{t1}$ of the uni-polar resistive memory material layer (that is, $|V_{t1}|$). In this case, in order to record the bit value "1" in the unit resistive memory cell $MC_U$, a voltage that is equal to or greater than the set voltage of the uni-polar resistive memory material layer may be applied (between the conductive lines $L_1$ and $L_2$) to switch the uni-polar and bi-polar resistive memory material layers to the low resistance states. After that, a voltage between the reset voltage $V_{t4}$ of the bi-polar resistive memory material layer and the negative reset voltage $-V_{t1}$ of the uni-polar resistive material layer may be applied to switch the bi-polar resistive memory material layer to the high resistance state.

In the above examples, since one of the resistors $R_B$ and $R_U$ is in the high resistance state when recording the bit value "1", the current path between the conductive lines $L_1$ and $L_2$ is blocked, and thus, access to the other neighboring memory cells is not interfered. Thus, the rectifying device such as a diode or the switching device such as a transistor, which is adopted in a conventional resistive memory device, is not necessary.

Recording of Bit Value "0"

Figure 3C:
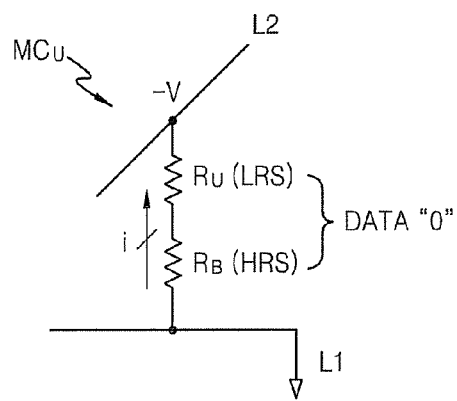

In order to record the bit value "0" in the unit resistive memory cell $MC_U$, the uni-polar resistive memory material layer is induced to the low resistance state and the bi-polar resistive memory material layer is induced to the high resistance state. Referring to FIG. 3C, when magnitudes of the set voltage $V_{t3}$ and the reset voltage $V_{t4}$ of the bi-polar resistive memory material layer (that is, $|V_{t3}|$ and $|V_{t4}|$) are both greater than the magnitudes of the reset voltage $V_{t1}$ and the set voltage $V_{t2}$ of the uni-polar resistive memory material layer (that is, $|V_{t1}|$ and $|V_{t2}|$), an appropriate negative voltage that is equal to or greater than, for example, the reset voltage $V_{t4}$ of the bi-polar resistive memory material layer may be applied between the conductive lines $L_1$ and $L_2$. In this case, the resistor $R_U$ changes to the low resistance state, however, the resistor $R_B$ changes to the high resistance state.

In addition, magnitudes of the set voltage $V_{t3}$ and the reset voltage $V_{t4}$ of the bi-polar resistive memory material layer (that is, $|V^{t3}|$ and $|V_{t4}|$) may each be greater than the magnitude of the reset voltage $V_{t1}$ of the uni-polar resistive memory material layer (that is, $|V_{t1}|$). In this case, in order to record the bit value "0", a voltage between the reset voltage $V_{t1}$ and the set voltage $V_{t2}$ of the uni-polar resistive memory material layer may be applied to switch the uni-polar resistive memory material layer to the high resistance state and the bi-polar resistive memory material layer to the low resistance state, respectively.

As described above, when recording the bit value "0", since one of the resistors $R_B$ and $R_U$ changes to the high resistance state, the current path between the conductive lines $L_1$ and $L_2$ is blocked, accesses to other neighboring memory cells are not interfered. This will be clear from a method of reading information as follows.

Figure 4A:
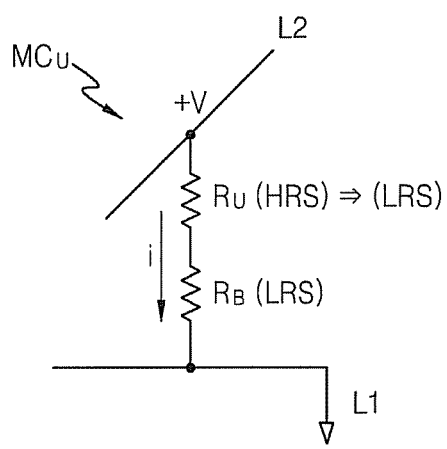
FIGS. 4A and 4B are equivalent circuit diagrams illustrating processes of reading information from unit resistive memory cells, in which bit values "1" and "0" are recorded respectively, according to an example embodiment of inventive concepts.
Figure 4B:
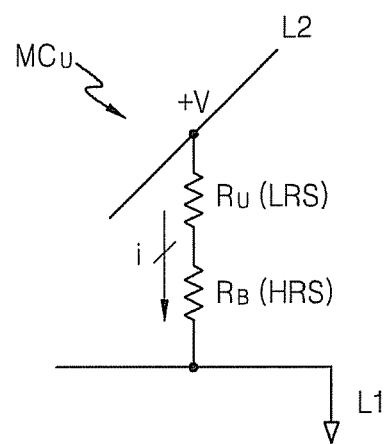

FIGS. 4A and 4B are equivalent circuit diagrams illustrating a method of reading information from unit resistive memory cells $MC_U$ in which bit value "1" or "0" is recorded, according to example embodiments of inventive concepts. In FIGS. 4A and 4B, like reference numerals as those of FIGS. 3A and 3B denote like elements, and detailed descriptions of like elements may not be provided here.

Referring to FIG. 4A, in a unit memory cell $MC_U$ in which the bit value "1" is recorded, the resistor $R_B$ is in the low resistance state and the resistor $R_U$ is in the high resistance state. In order to read the information from the unit memory cell $MC_U$, a voltage that may selectively switch the resistor $R_U$ to the low resistance state is applied to the unit memory cell.

For example, when magnitudes of the set voltage $V_{t3}$ and the reset voltage $V_{t4}$ of the bi-polar resistive memory material layer are both greater than the magnitudes of the reset voltage $V_{t1}$ and the set voltage $V_{t2}$ of the uni-polar resistive memory material layer, an appropriate positive voltage that is greater than the set voltage $V_{t2}$ of the uni-polar resistive memory material layer and smaller than the set voltage $V_{t3}$ of the bi-polar resistive memory material layer may be applied to the unit memory cell. As another example, a negative voltage that is smaller than the negative set voltage $-V_{t2}$ of the uni-polar resistive memory material layer and greater than the reset voltage $V_{t4}$ of the bi-polar resistive memory material layer may be applied to the unit memory cell. In this case, the uni-polar resistive memory material layer is switched to the low resistance state, and current i flows between the conductive lines $L_1$ and $L_2$. The bit value "1" of the corresponding unit memory cell may be read by sensing the current i.

In another example, when magnitudes of the set voltage $V_{t3}$ and the reset voltage $V_{t4}$ of the bi-polar resistive memory material layer are each smaller than the magnitude of the set voltage $V_{t2}$ of the uni-polar resistive memory material layer, a voltage that is greater than the set voltage $V_{t3}$ of the bi-polar resistive memory material layer and smaller than the set voltage $V_{t2}$ of the uni-polar resistive memory material layer may be applied to the unit memory cell for reading the bit value.

Referring to FIG. 4B, in a unit memory cell $MC_U$ in which the bit value "0" is recorded, the resistor $R_B$ is in the high resistance state and the resistor $R_U$ is in the low resistance state. In order to read the bit value from the unit memory cell $MC_U$, a voltage that may selectively switch the resistor $R_U$ to the low resistance state is applied to the unit memory cell, as described with reference to FIG. 4A. For example, when magnitudes of the set voltage $V_{t3}$ and the reset voltage $V_{t4}$ of the bi-polar resistive memory material layer are greater than the magnitude of the reset voltage $V_{t1}$ and the set voltage $V_{t2}$ of the uni-polar resistive memory material layer, respectively, a positive voltage that is greater than the set voltage $V_{t2}$ of the uni-polar resistive memory material layer and smaller than the set voltage $V_{t3}$ of the bi-polar resistive memory material layer may be applied to the unit memory cell for reading the bit value. In this case, since the bi-polar resistive memory material layer is in the high resistance state, current i does not flow between the conductive lines $L_1$ and $L_2$. Then, the bit value "0" of the corresponding unit memory cell may be read by sensing that the current i does not flow.

In addition, as another example, when magnitudes of the set voltage $V_{t3}$ and the reset voltage $V_{t4}$ of the bi-polar resistive memory material layer are each smaller than the magnitude of the set voltage $V_{t2}$ of the uni-polar resistive memory material layer, a voltage that is greater than the set voltage $V_{t3}$ of the bi-polar resistive memory material layer and smaller than the set voltage $V_{t2}$ of the uni-polar resistive memory material layer may be applied to the unit memory cell for reading the bit value. In this case, the bit value "0" of the corresponding unit memory cell may be read by sensing that the current i does not flow.

Figure 5:
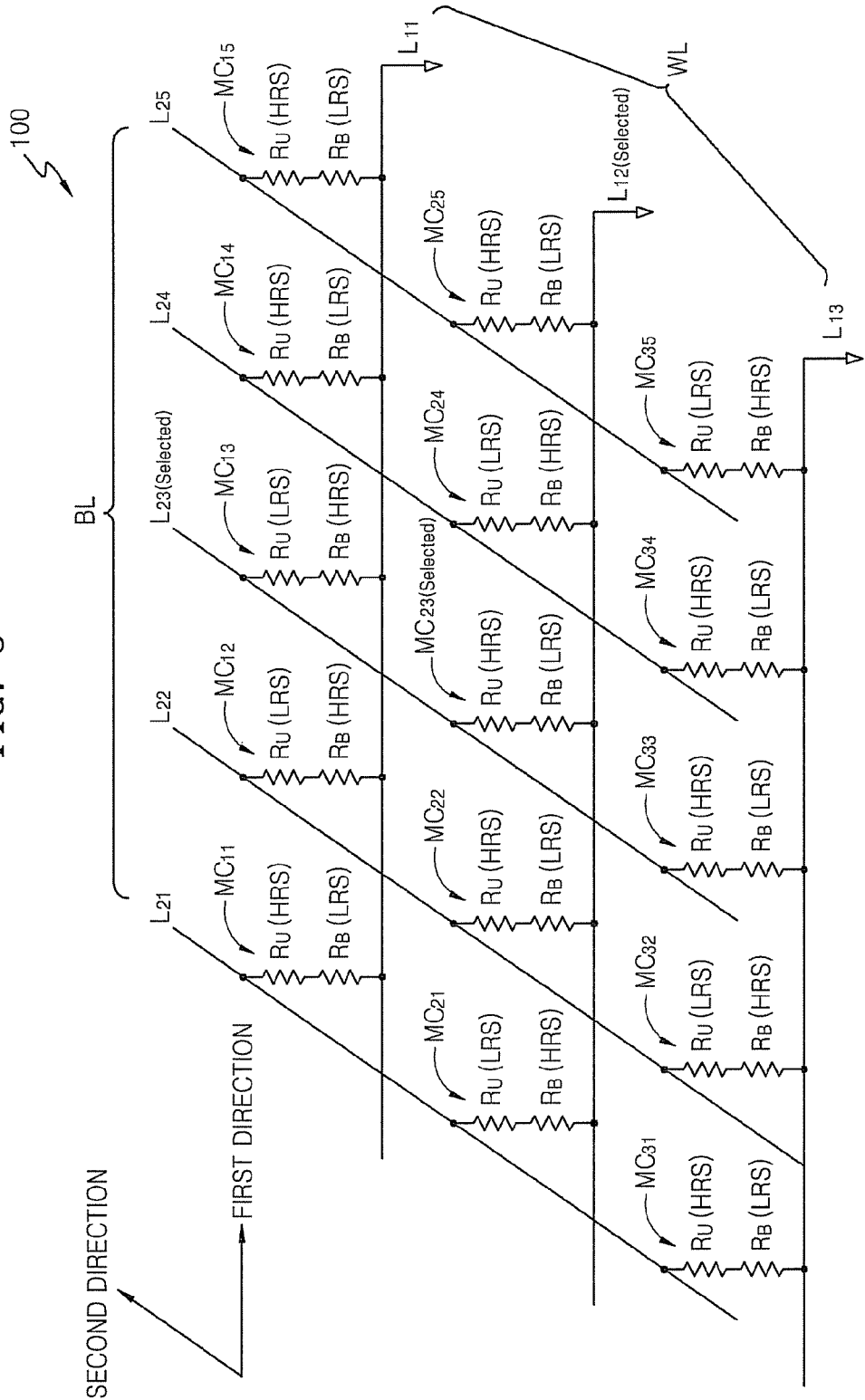
FIG. 5 is an equivalent circuit diagram of a semiconductor device including an array of the unit memory cells, according to an example embodiment of inventive concepts.

FIG. 5 is an equivalent circuit diagram of a semiconductor device 100 including an array of the unit memory cells, according to an example embodiment of inventive concepts.

Referring to FIG. 5, the semiconductor device 100 includes a plurality of first signal lines $L_{11}$, $L_{12}$, and $L_{13}$, a plurality of second signal lines $L_{21}$, $L_{22}$, $L_{23}$, $L_{24}$, and $L_{25}$, and a plurality of memory cells $MC_{11}$, $MC_{12}$, ..., $MC_{34}$, and $MC_{35}$. FIG. 5 shows a 3×5 array, but the array is an example, and the number of the signal lines and the memory cells may be increased.

The plurality of first signal lines $L_{11}$, $L_{12}$, and $L_{13}$ may extend in parallel with each other in a first direction. The plurality of second signal lines $L_{21}$, $L_{22}$, $L_{23}$, $L_{24}$, and $L_{25}$ may extend in parallel with each other in a second direction. As shown in FIG. 5, the plurality of first signal lines $L_{11}$, $L_{12}$, and $L_{13}$ may be word lines, and the plurality of second signal lines $L_{21}$, $L_{22}$, $L_{23}$, $L_{24}$, and $L_{25}$ may be bit lines. However, inventive concepts are not limited thereto, and the plurality of first signal lines $L_{11}$, $L_{12}$, and $L_{13}$ may be bit lines, and the plurality of second signal lines $L_{21}$, $L_{22}$, $L_{23}$, $L_{24}$, and $L_{25}$ may be word lines.

The plurality of memory cells $MC_{11}$, $MC_{12}$, ..., $MC_{34}$, and $MC_{35}$ may be connected to intersections, respectively, where the plurality of first signal lines $L_{11}$, $L_{12}$, and $L_{13}$ and the plurality of second signal lines $L_{21}$, $L_{22}$, $L_{23}$, $L_{24}$, and $L_{25}$ cross over each other. Each of the plurality of memory cells $MC_{11}$, $MC_{12}$, ..., $MC_{34}$, and $MC_{35}$ may include the uni-polar variable resistor $R_U$ and the bi-polar variable resistor $R_B$ connected to each other serially. The connecting order of the uni-polar variable resistor $R_U$ and the bi-polar variable resistor $R_B$ is not fixed, and inventive concepts are not limited to the example above.

As described above, the bit value "1" or "0" may be aligned to a selected memory cell according to the combination of the set and reset states of the uni-polar variable resistor $R_U$ and the bi-polar variable resistor $R_B$ which are connected in series, and the information may be recorded in the selected memory cell. For example, in order to record the bit value "1" in the selected memory cell $MC_{23}$, the uni-polar variable resistor $R_U$ of the selected memory cell $MC_{23}$ may be induced to the high resistance state and the bi-polar variable resistor $R_B$ of the selected memory cell $MC_{23}$ may be induced to the low resistance state.

For example, a positive voltage $V_{t3}$ is applied between the selected word line $L_{12}$ and the selected bit line $L_{23}$ to switch the uni-polar variable resistor $R_U$ and the bi-polar variable resistor $R_B$ to the low resistance states, and then, a voltage that is greater than the reset voltage $V_{RESET}$ of the uni-polar resistive memory material layer and smaller than the set voltage $V_{SET}$ of the uni-polar resistive memory material layer is applied between the selected word line $L_{12}$ and the selected bit line $L_{23}$ to selectively switch the uni-polar variable resistor $R_U$ to the high resistance state.

In addition, in order to record the bit value "0" in the selected memory cell, the uni-polar variable resistor $R_U$ may be induced to the low resistance state and the bi-polar variable resistor $R_B$ may be induced to the high resistance state. To this end, the negative reset voltage of the bi-polar variable resistor $R_B$ may be applied to the selected word line.

As described above, an appropriate word line and bit line are selected, and then, bit value "1" or "0" may be recorded in the memory cell located on the intersection of the word and bit lines by accessing the corresponding memory cell of the intersection. In FIG. 5, illustrated resistance states of the variable resistances are examples, and in particular, in the selected memory cell $MC_{23}$, the uni-polar variable resistor $R_U$ is in the high resistance state and the bi-polar variable resistor $R_B$ is in the low resistance state, and thus, the bit value "1" is recorded in the memory cell $MC_{23}$.

In order to read the bit value recorded in the selected memory cell $MC_{23}$, a certain voltage that switches the uni-polar variable resistance to the low resistance state and does not switch the bi-polar variable resistance, for example, the set voltage of the uni-polar variable resistance, may be applied to the selected memory cell $MC_{23}$. In this case, as denoted by the dotted line in FIG. 3, the current i flows through the selected memory cell $MC_{23}$, and the bit value "1" may be read. In other memory cells that are not selected, one of the uni-polar variable resistance and the bi-polar variable resistance is in the high resistance state in both cases where the bit value "1" and "0" are recorded, and thus, the current path is blocked and the current only flows through the selected memory cell $MC_{23}$, and a reading error does not occur. Therefore, according to inventive concepts, the rectifying device such as a diode or the switching device such as a transistor that is used in the conventional resistive memory device may be omitted.

In addition, since the diode or the transistor is not necessary, a driving voltage for accessing the memory cell, which is the sum of the threshold voltage of the diode and the recording voltage of the variable resistance, may be reduced, and accordingly, the entire driving voltage is reduced. Therefore, a size of a boosting circuit may be reduced, and a current level can be reduced.

Figure 6:
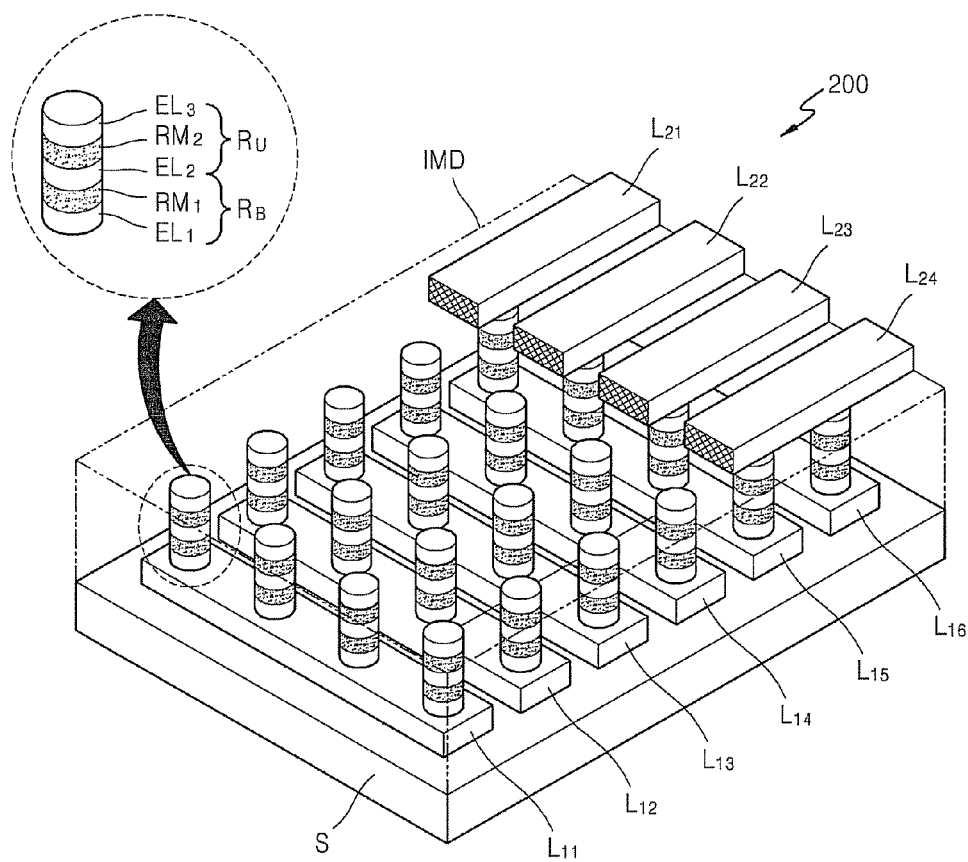
FIG. 6 is a cutaway perspective view illustrating a memory cell in a semiconductor device according to an example embodiment of inventive concepts.

FIG. 6 is a cutaway perspective view illustrating a memory cell in a semiconductor device 200 according to an example embodiment of inventive concepts.

Referring to FIG. 6, the semiconductor device 200 includes a plurality of first conductive lines $L_{11}$, $L_{12}$, $L_{13}$, $L_{14}$, $L_{15}$ and $L_{16}$ formed on a substrate S. The bi-polar variable resistor $R_B$ and the uni-polar variable resistor $R_U$ constituting the memory cell are stacked on the first conductive lines $L_{11}$, $L_{12}$, $L_{13}$, $L_{14}$, $L_{15}$ and $L_{16}$ in the shown order, or an inverse order. The bi-polar variable resistor $R_B$ and the uni-polar variable resistor $R_U$ include resistive memory material layers $RM_1$ and $RM_2$, respectively, having corresponding characteristics. An electrode layer $EL_2$ may be provided between the resistive memory material layers $RM_1$ and $RM_2$. In addition, an electrode layer $EL_1$ may be provided between the resistive memory material layer $RM_1$ and a corresponding conductive line from among the first conductive lines $L_{11}$, $L_{12}$, $L_{13}$, $L_{14}$, $L_{15}$ and $L_{16}$.

Otherwise, although it is not shown in FIG. 6, one or more additional layers may be additionally provided in order to improve contact characteristics between the first conductive lines $L_{11}$, $L_{12}$, $L_{13}$, $L_{14}$, $L_{15}$ and $L_{16}$ and the electrode layer $EL_1$ of each of the memory cells. The additional layers may have the same pattern as those of the first conductive lines $L_{11}$, $L_{12}$, $L_{13}$, $L_{14}$, $L_{15}$ and $L_{16}$ or the same pattern as that of the electrode layer $EL_1$.

The bi-polar and uni-polar variable resistors $R_B$ and $R_U$ are locally formed in an interlayer dielectric IMD, and have pillar structures that extend perpendicular to a main surface of the substrate S. As a pillar structure, FIG. 6 shows a cylinder shape, but inventive concepts are not limited thereto, and the pillar structure may be an oval or square pillar.

The pillar structure may be provided by forming the interlayer dielectric IMD on the first conductive lines $L_{11}$, $L_{12}$, $L_{13}$, $L_{14}$, $L_{15}$ and $L_{16}$ and sequentially stacking the resistive memory material layers $RM_1$ and $RM_2$ with required electrode layers $EL_1$, $EL_2$, and $EL_3$ in holes formed to expose the first conductive lines $L_{11}$, $L_{12}$, $L_{13}$, $L_{14}$, $L_{15}$ and $L_{16}$. Otherwise, the memory material layers $RM_1$ and $RM_2$ may be sequentially stacked with required electrode layers $EL_1$, $EL_2$, and $EL_3$ on the first conductive lines $L_{11}$, $L_{12}$, $L_{13}$, $L_{14}$, $L_{15}$ and $L_{16}$, and after that, the stacked structure is patterned once to form the pillar structures. Then, the interlayer dielectric IMD is formed on the resultant pillar structures.

Second conductive lines $L_{21}$, $L_{22}$, $L_{23}$ and $L_{24}$ are formed on the interlayer dielectric IMD, and then, the non-volatile memory device including memory cells that are locally formed on intersections between the first conductive lines $L_{11}$, $L_{12}$, $L_{13}$, $L_{14}$, $L_{15}$ and $L_{16}$ and the second conductive lines $L_{21}$, $L_{22}$, $L_{23}$ and $L_{24}$ may be finished. One of the first conductive lines $L_{11}$, $L_{12}$, $L_{13}$, $L_{14}$, $L_{15}$ and $L_{16}$ and the second conductive lines $L_{21}$, $L_{22}$, $L_{23}$ and $L_{24}$ which extend in parallel with the main surface of the substrate S are bit lines, and the other are word lines. The above-described structure may be fabricated three times with a photolithography process, to form a $4F^2$ array having high integrity.

Figure 7:
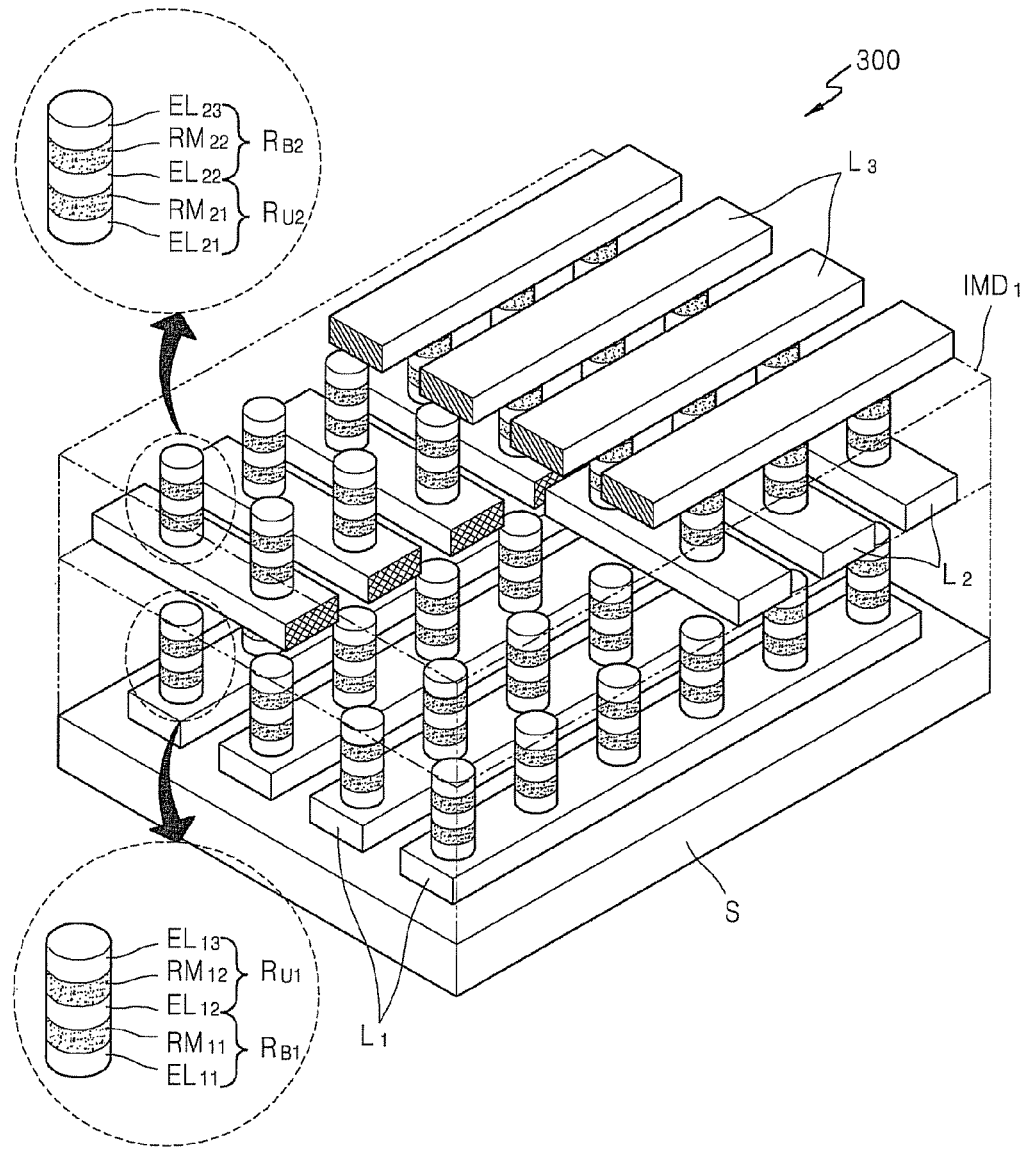
FIG. 7 is a cutaway view illustrating a memory cell in a semiconductor device according to another example embodiment of inventive concepts.

FIG. 7 is a cutaway perspective view showing a memory cell structure in a semiconductor device 300 according to an example embodiment of inventive concepts.

Referring to FIG. 7, the semiconductor device 300 has a three-dimensional structure, in which lower and upper memory cell arrays each having a similar structure to that of the memory cell structure in the semiconductor device 200 are stacked perpendicular to the main surface of the substrate S. The three-dimensional structure includes a first pillar that includes the bi-polar variable resistor $R_{B1}$ and the uni-polar variable resistor $R_{U1}$ between the first and second conductive lines $L_1$ and $L_2$. In addition, the three-dimensional structure includes a second pillar that includes the bi-polar variable resistor $R_{B2}$ and the uni-polar variable resistor $R_{U2}$ between the second and third conductive lines $L_2$ and $L_3$.

In the present embodiment, the first and third conductive lines $L_1$ and $L_3$ may be bit lines, and the second conductive lines $L_2$ may be common word lines shared by the upper and lower memory cell arrays. In another example, the three dimensional structure shown in FIG. 7 may be extended to a structure including multiple layers, for example, four memory cell array layers or eight memory cell array layers, by repeatedly forming the pillars, the bit lines, and the word lines. The above three-dimensional structure may increase the integrity of the semiconductor device 300, and the processes for fabricating common elements may be reduced. Thus, fabrication costs of the three-dimensional semiconductor device 300 may be reduced.

Figure 8:
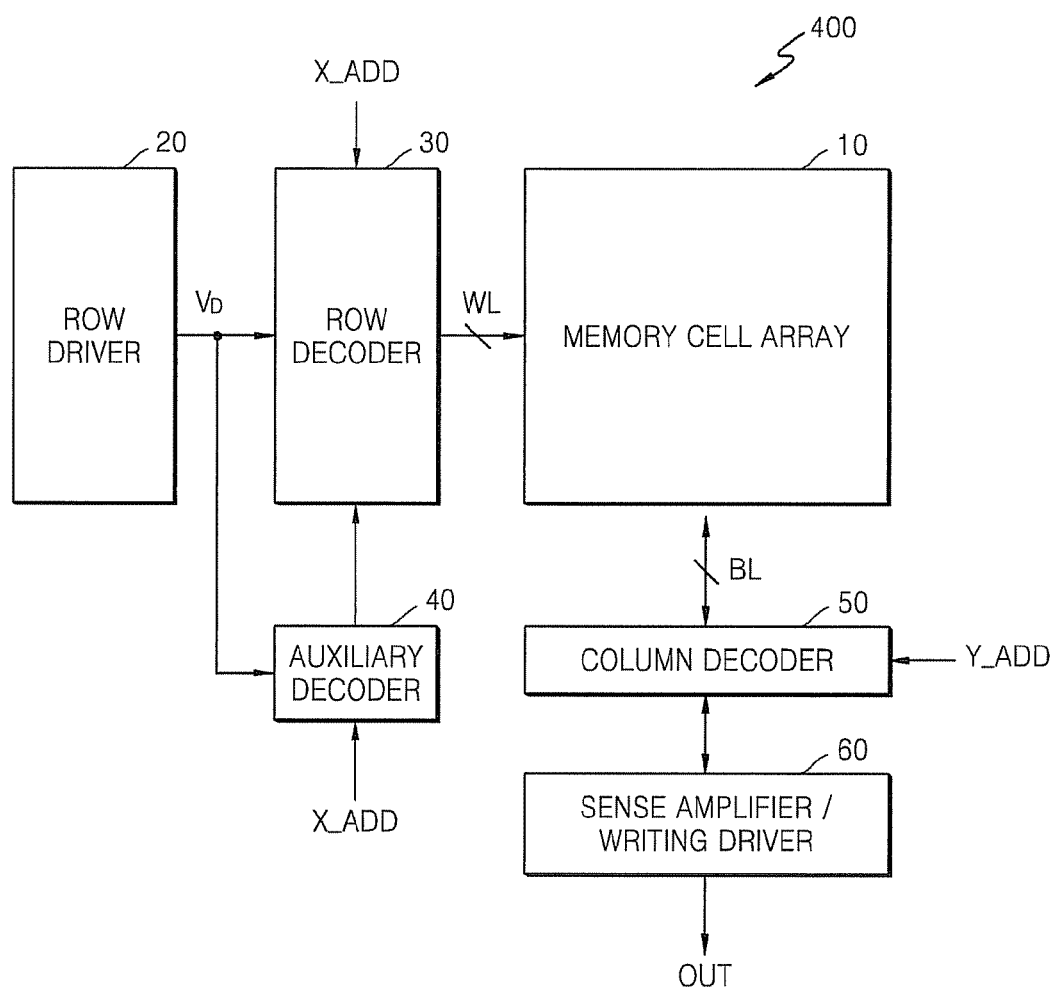
FIG. 8 is a block diagram of a semiconductor device according to an example embodiment of inventive concepts.

FIG. 8 is a block diagram of a semiconductor device 400 according to an example embodiment of inventive concepts.

Referring to FIG. 8, the semiconductor device 400 includes a memory cell array 10, a row driver 20, a row decoder 30, an auxiliary decoder 40, a column decoder 50, and a sense amplifier/recording driver 60.

The memory cell array 10 may include a plurality of word lines, a plurality of bit lines, and a plurality of memory cells arranged on intersections where the plurality of word lines and the plurality of bit lines cross over each other. Each of the plurality of memory cells may include bi-polar and uni-polar variable resistors $R_{U1}$, $R_{B1}$ or $R_{U2}$, $R_{B2}$ which are serially connected to each other as shown in FIG. 7. The plurality of word lines may include a plurality of main word lines and a plurality of sub-word lines.

The row driver 20 may generate a driving voltage $V_D$ that is applied to the plurality of word lines in the memory cell array 10. The row decoder 30 decodes a bit value of a row address X_ADD to a first address signal in order to activate at least one main word line. The auxiliary decoder 40 decodes the remaining bit values of the row address X_ADD to second address signals corresponding to sub-word lines of the word lines in order to activate one or more sub-word lines. Here, a main word line may be a global word line, and a sub-word line may be a local word line. However, in another embodiment, the semiconductor 400 may not include the auxiliary decoder 40, and the row decoder 30 may decode the row address X_ADD to address signals corresponding to the plurality of word lines.

The column decoder 50 may decode a column address Y_ADD to select at least one corresponding bit line. The sense amplifier/recording driver 60 receives data from the memory cells in order to read the bit values of the memory cells included in the memory cell array 10, or may apply a voltage to the plurality of bit lines of the memory cell array 10 to record bit values in the memory cells.

Figure 9:
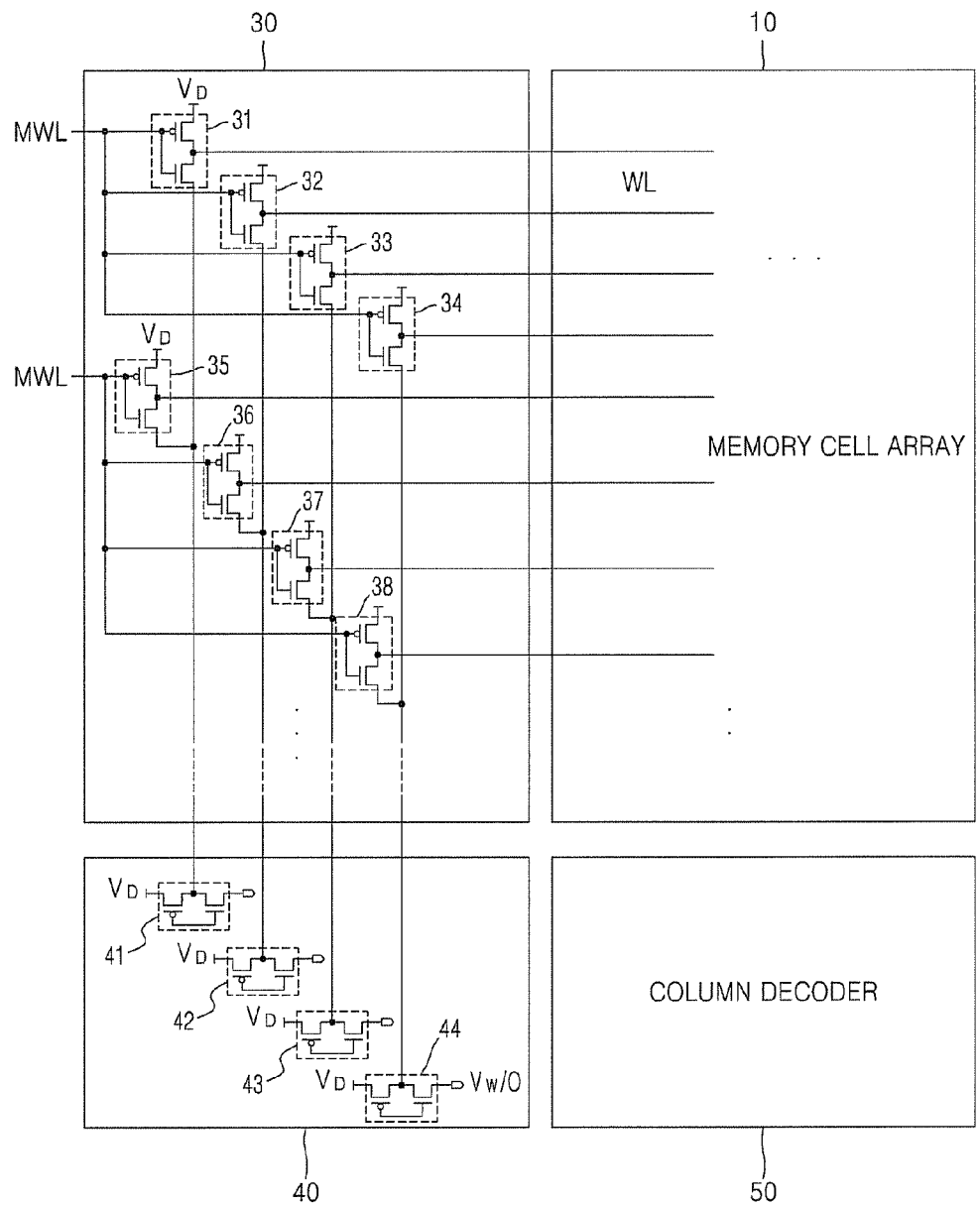
FIG. 9 is a circuit diagram showing a row decoder and an auxiliary decoder shown in FIG. 8, according to an example embodiment of inventive concepts.

FIG. 9 is a circuit diagram of the row decoder 30 and the auxiliary decoder 40 shown in FIG. 8, according to an example embodiment of inventive concepts.

Referring to FIG. 9, the row decoder 30 decodes a bit value of the row address X_ADD into the first address signal corresponding to the main word line MWL, and may include first through eighth transfer units 31 through 38. When the first address signal is logic low, the first through eighth transfer units 31 through 38 may provide the sub-word lines WL with the driving voltage $V_D$ of the row driver 20. On the other hand, when the first address signal is logic high, the first through eighth transfer units 31 through 38 may provide the sub-word lines WL with the voltage of the auxiliary decoder 40.

The auxiliary decoder 40 decodes the remaining bit values of the row address X_ADD into the second address signals corresponding to the sub-word lines WL, and may include ninth through twelfth transfer units 41 through 44. When the second address signal is logic low, the ninth through twelfth transfer units 41 through 44 may provide the sub-word lines WL with the driving voltage $V_D$ of the row driver 20. On the other hand, when the second address signal is logic high, the ninth through twelfth transfer units 41 through 44 may provide the sub-word lines WL with a writing voltage $V_W$ or a ground voltage 0V. Thus, a forward or backward voltage is applied to each of the memory cells so as to record the bit value "0" or "1" in the memory cells.

Figure 10:
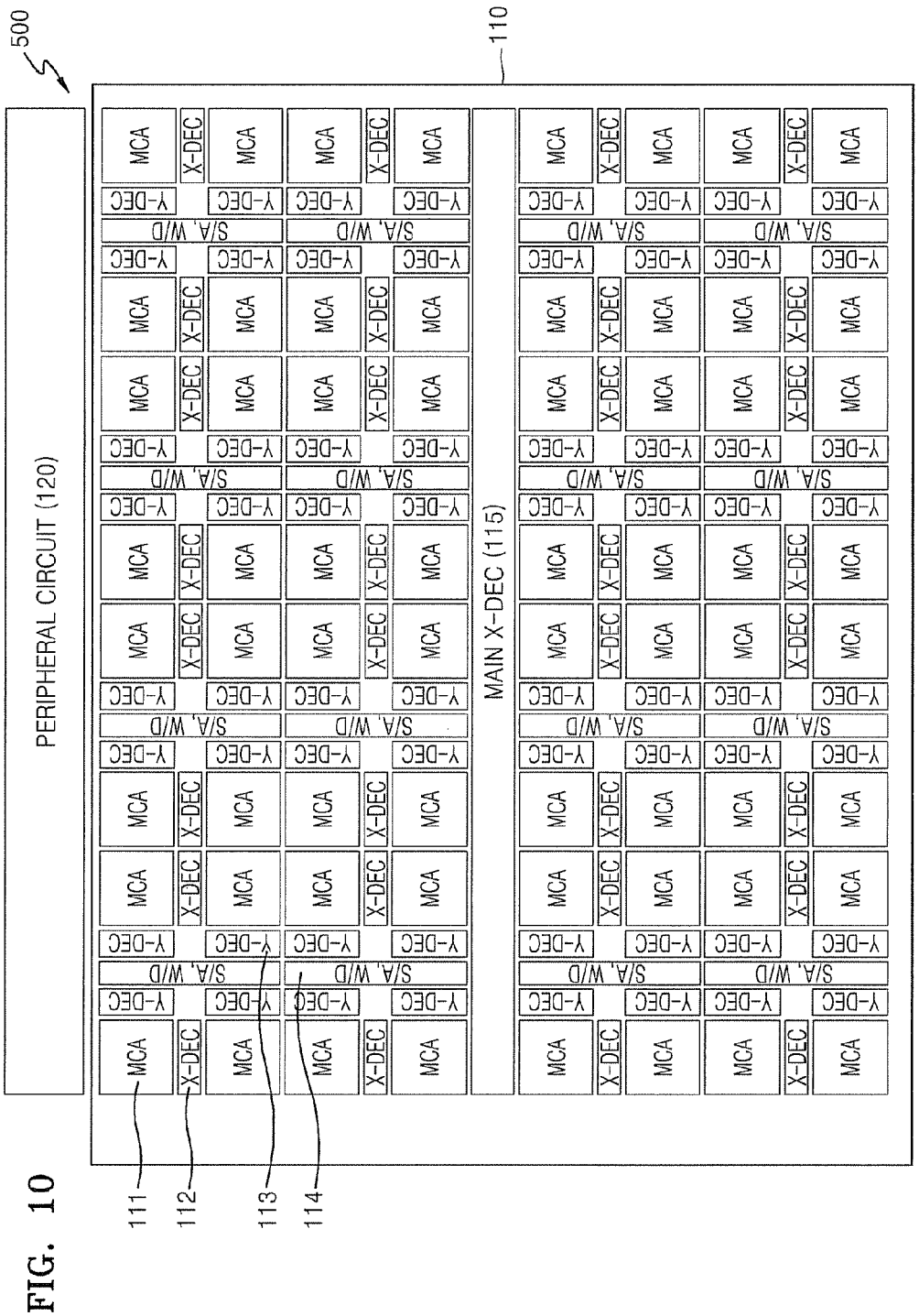
FIG. 10 is a diagram of a semiconductor device according to an example embodiment of inventive concepts.

FIG. 10 is a diagram of a semiconductor device 500 according to an example embodiment of inventive concepts.

Referring to FIG. 10, the semiconductor device 500 may include a memory core 110 and a peripheral circuit 120. The memory core 110 includes a plurality of memory cell arrays MCA 111, a plurality of row decoders X-DEC 112, a plurality of column decoders Y-DEC 113, a plurality of sense amplifiers/recording drivers (S/A, W/D) 114, and a main row decoder 115. The peripheral circuit 120 may include the row driver 20 shown in FIG. 8.

Figure 11:
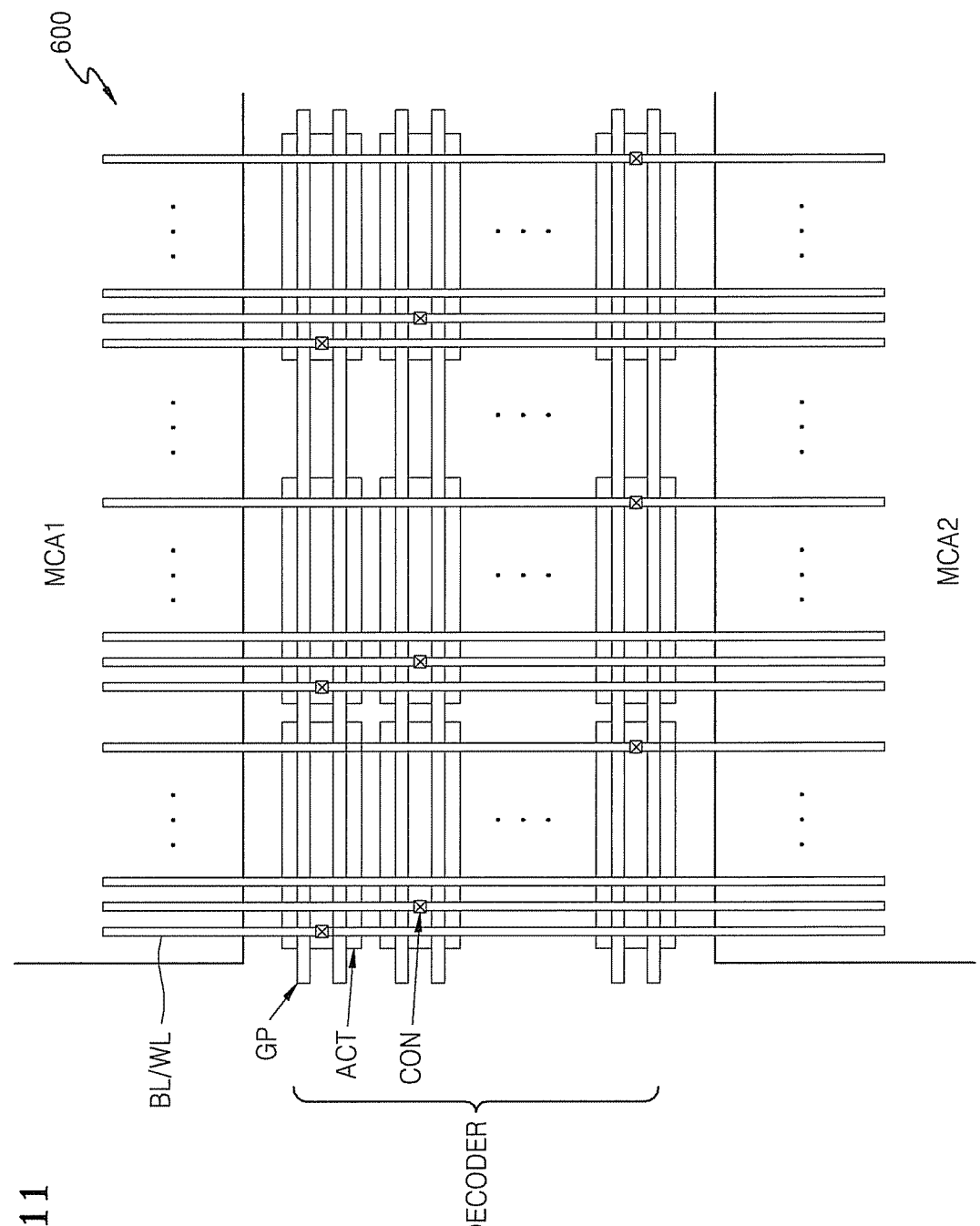
FIG. 11 is a plan view of a semiconductor device according to an example embodiment of inventive concepts.

FIG. 11 is a plan view of a semiconductor device 600 according to an example embodiment of inventive concepts.

Referring to FIG. 11, a decoder that is commonly connected to first and second memory cell arrays MCA1 and MCA2 may be located in a different layer from that of the first and second memory cell arrays MCA1 and MCA2. For example, the first and second memory cell arrays MCA1 and MCA2 may be disposed in an upper layer, and the decoder may be dispose in a lower layer so as to reduce an effective area of the entire semiconductor device 600. Otherwise, the decoder may be disposed in the upper layer and the first and second memory cell arrays MCA1 and MCA2 may be disposed in the lower layer.

In more detail, gate electrodes GP are formed on active areas ACT of the decoder, and source/drain regions may be formed on both sides of the gate electrodes GP. Here, the source/drain regions may connect to the plurality of bit lines BL or the plurality of word lines WL of the first and second memory cell arrays MCA1 and MCA2 through contacts CON.

Figure 12:
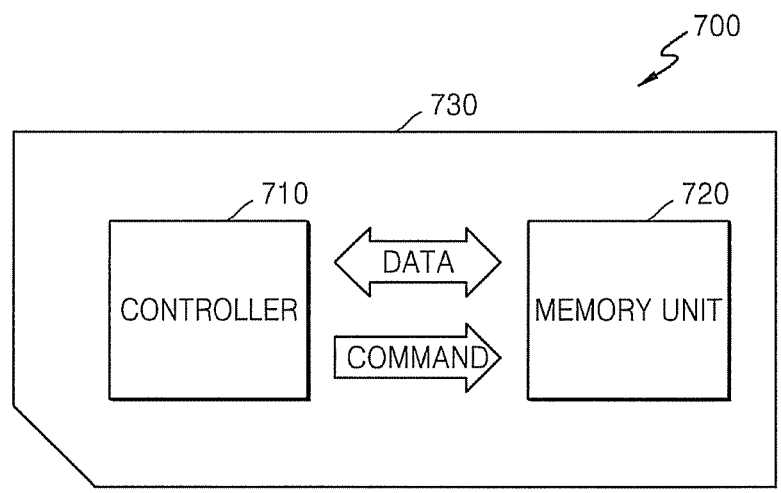
FIG. 12 is a schematic diagram of a memory card according to an example embodiment of inventive concepts.

FIG. 12 is a schematic diagram of a memory card 700 according to an example embodiment of inventive concepts.

Referring to FIG. 12, the memory card 700 may include a controller 710 and a memory unit 720 in a housing 730, and the controller 710 and the memory unit 720 may exchange electric signals with each other. For example, the memory unit 720 and the controller 710 may send/receive data to/from each other according to a command of the controller 710. Accordingly, the memory card 700 may store the data in the memory unit 720 or output the data to the outside from the memory unit 720.

For example, the memory unit 720 may include one of the semiconductor devices described with reference to FIGS. 1 through 12. The memory card 700 may be used as a data storage medium of various appliances/portable devices. For example, the memory card 700 may be a multi media card (MMC) or a secure digital (SD) card.

Figure 13:
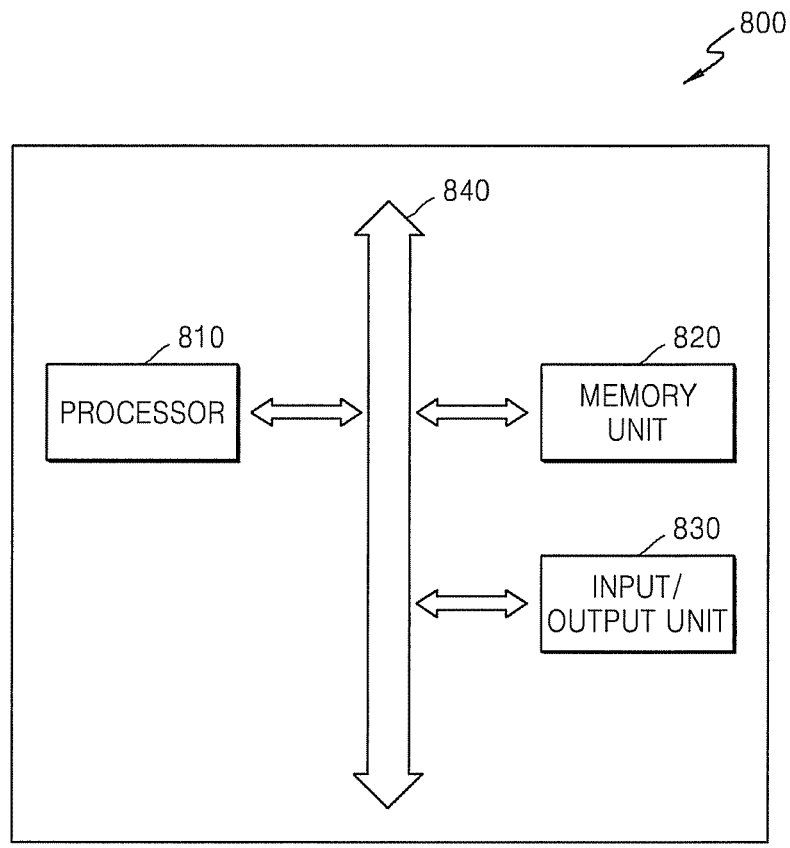
FIG. 13 is a schematic diagram of an electronic system according to an example embodiment of inventive concepts.

FIG. 13 is a schematic diagram of an electronic system 800 according to an example embodiment of inventive concepts.

Referring to FIG. 13, the electronic system 800 may include a processor 810, a memory unit 820, and an input/output unit 830, which perform data communication with each other via a bus 840. The processor 810 may execute a program and control the system 800. The input/output unit 830 may be used to input or output data of the electronic system 800. The electronic system 800 may be connected to an external device (not shown) such as a personal computer or a network, by using the input/output unit 830 to exchange data with the external device. The memory unit 820 may store codes for operating the processor 810 and data. For example, the memory unit 820 may include one of the semiconductor devices described with reference to FIGS. 1 through 12.

The electronic system 800 may be included in various electronic controllers requiring a memory. For example, the electronic system 800 may be applied to electronic appliances such as micro controllers, mobile phones, MP3 players, navigation systems, solid state drives (SSDs), and household appliances.

While inventive concepts have been particularly shown and described with reference to example embodiments thereof, it will be understood that various changes in form and details may be made therein without departing from the spirit and scope of the following claims.

What is claimed is:

1. A semiconductor device comprising:
    a plurality of memory cells, at least one memory cell including a uni-polar variable resistor and a bi-polar variable resistor connected in series and configured to switch between low resistance states and high resistance states, respectively, according to an applied voltage, and a magnitude of resistance of the uni-polar variable resistor varies regardless of a polarity of the applied voltage, and a magnitude of resistance of the bi-polar variable resistor is based on the polarity of the applied voltage, wherein
    a set voltage and a reset voltage of the bi-polar variable resistor are smaller than a reset voltage of the uni-polar variable resistor.

2. The semiconductor device of claim 1, wherein a bit value stored in the at least one memory cell corresponds to one of the uni-polar variable resistor and the bi-polar variable resistor being in the low resistance state and the other variable resistor being in the high resistance state.

3. The semiconductor device of claim 1, wherein the magnitudes of the set voltage and the reset voltage of the bi-polar variable resistor are greater than a magnitude of a set voltage of the uni-polar variable resistor.

4. The semiconductor device of claim 3, wherein the at least one memory cell is configured to receive a voltage for switching the uni-polar variable resistor to the low resistance state to read a bit value stored in the at least one memory cell.

5. The semiconductor device of claim 1, wherein a voltage for switching the bi-polar variable resistor to the low resistance state is applied to the one or more memory cells to read a bit value stored in the plurality of memory cells.

6. The semiconductor device of claim 1, wherein the uni-polar variable resistor and the bi-polar variable resistor comprise:
    a first electrode layer and a second electrode layer facing each other; and
    a uni-polar resistive material layer and a bi-polar resistive material layer between the first and second electrode layers.

7. The semiconductor device of claim 6, wherein the uni-polar variable resistor and the bi-polar variable resistor may further comprise a third electrode layer between the uni-polar and bi-polar resistive material layers.

8. The semiconductor device of claim 6, wherein each of the uni-polar and bi-polar resistive material layers comprises a transition metal oxide, a chalcogen-based compound, or a perovskite-based compound.

9. The semiconductor device of claim 6, wherein each of the first and second electrode layers is formed of one selected from the group consisting of Pt, Ru, Ir, Ag, Al, Ti, Ta, W, Si, Cu, Ni, Co, conductive nitrides thereof, conductive oxides thereof, and combinations thereof.

10. The semiconductor device of claim 1, wherein the plurality of memory cells are arranged in a matrix, and the semiconductor device further comprises:
    first signal lines and second signal lines electrically connected to ends of the plurality of memory cells.

11. The semiconductor device of claim 10, wherein the plurality of memory cells are between the first and second signal lines where the first and second signal lines cross over each other.

12. The semiconductor device of claim 11, wherein the uni-polar and bi-polar variable resistors have pillar structures, the pillar structures being perpendicular to a main surface of a substrate.

13. The semiconductor device of claim 12, wherein the pillar structure includes a plurality of pillars being stacked perpendicular to the main surface of the substrate, and at least one of the first and second signal lines is between two stacked pillars of the plurality of pillars.

14. A method of driving a semiconductor device including a uni-polar variable resistor and a bi-polar variable resistor connected in series and configured to be switched between low resistance states and high resistance states, respectively, the method comprising:

recording a bit value by setting one of the uni-polar variable resistor and the bi-polar variable resistor to the low resistance state and the other to the high resistance state, the set states of the uni-polar variable resistor and the bi-polar variable resistor corresponding to the bit value, wherein magnitudes of a set voltage and a reset voltage of the bi-polar variable resistor are smaller than a magnitude of a reset voltage of the uni-polar variable resistor.

15. The method of claim 14, wherein the magnitudes of the set voltage and the reset voltage of the bi-polar variable resistor are greater than a magnitude of a set voltage of the uni-polar variable resistor.

16. The method of claim 14, wherein the recording comprises:

switching the uni-polar and bi-polar variable resistors to low resistance states by applying a first voltage to the uni-polar and bi-polar variable resistors, the first applied voltage being equal to or greater than a set voltage of the uni-polar variable resistor; and switching the bi-polar variable resistor to the high resistance state by applying a second voltage to the uni-polar and bi-polar variable resistors, the second applied voltage being between the reset voltage of the bi-polar variable resistor and a negative set voltage of the uni-polar variable resistor.

17. The method of claim 14, wherein the recording comprises:

switching the uni-polar variable resistor to the high resistance state and the bi-polar variable resistor to the low resistance state, by applying a voltage to the uni-polar and bi-polar variable resistors, the applied voltage being between the reset voltage and a set voltage of the uni-polar variable resistor.

18. The method of claim 14, further comprising:

reading the bit value by switching the bi-polar variable resistor to the low resistance state.

19. The method of claim 18, wherein the reading comprises:

applying a voltage that is greater than the set voltage of the bi-polar variable resistor and smaller than the reset voltage of the uni-polar variable resistor.

20. An electronic system comprising:

a bus;

a processor configured to transmit and receive data through the bus; and a memory unit configured to store the data, the memory unit including a semiconductor device having, a plurality of memory cells, at least one memory cell including a first type resistor and a second type resistor connected in series and configured to switch between at least first and second resistance states, respectively, according to an applied voltage, and resistances of the first type resistor and the second type resistor vary differently from one another with respect to a polarity of the applied voltage, the first type resistor being a uni-polar variable resistor and the second type resistor being a bi-polar variable resistor, wherein a set voltage and a reset voltage of the second type resistor are smaller than a reset voltage of the first type resistor.

21. The electronic system of claim 20, wherein a bit value stored in the at least one memory cell corresponds to the first type resistor being in the first resistance state and the second type resistor being in the second resistance state.

* * * * *